US010354943B1

(12) United States Patent
Stoek et al.

(10) Patent No.: US 10,354,943 B1
(45) Date of Patent: Jul. 16, 2019

(54) MULTI-BRANCH TERMINAL FOR INTEGRATED CIRCUIT (IC) PACKAGE

(71) Applicant: Infineon Technologies AG, Neubiberg (DE)

(72) Inventors: Thomas Stoek, Buxtehude (DE); Chii Shang Hong, Melaka (MY); Chiew Li Tai, Melaka (MY); Edmund Sales Cabatbat, Roxas (PH)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/033,756

(22) Filed: Jul. 12, 2018

(51) Int. Cl.
*H01L 23/495* (2006.01)
*H01L 23/00* (2006.01)

(52) U.S. Cl.
CPC .. *H01L 23/49548* (2013.01); *H01L 23/49589* (2013.01); *H01L 24/48* (2013.01); *H01L 24/49* (2013.01); *H01L 2224/48175* (2013.01); *H01L 2224/4912* (2013.01)

(58) Field of Classification Search
CPC ............... H01L 21/4842; H01L 21/565; H01L 23/49548; H01L 23/49562; H01L 23/49575; H01L 23/49582; H01L 23/49589; H01L 24/06; H01L 24/48; H01L 24/49

USPC .......................... 257/666, 676; 438/123, 124
See application file for complete search history.

(56) References Cited

U.S. PATENT DOCUMENTS

| | | | | |
|---|---|---|---|---|
| 2010/0052124 A1* | 3/2010 | Sasaki | ................. | H01L 21/4842 257/676 |
| 2010/0059875 A1* | 3/2010 | Sato | .................... | H01L 23/4952 257/690 |
| 2013/0307132 A1* | 11/2013 | Kawabata | ........... | H01L 23/4952 257/676 |
| 2015/0270208 A1 | 9/2015 | Otremba et al. | | |

FOREIGN PATENT DOCUMENTS

DE  201410104013  9/2015

* cited by examiner

*Primary Examiner* — Brook Kebede
(74) *Attorney, Agent, or Firm* — Harrity & Harrity, LLP

(57) ABSTRACT

An example multi-branch terminal for an integrated circuit (IC) package is described herein. An example multi-branch terminal of an integrated circuit (IC), may include a first branch that may include an active bonding with a chip of the IC, wherein the active bonding may include a wire bonded to the chip of the IC; and a second branch that may include a passive bonding with the chip of the IC, wherein the passive bonding may include a capacitor bonded to the second branch and a first terminal of the IC.

20 Claims, 4 Drawing Sheets

US 10,354,943 B1

MULTI-BRANCH TERMINAL FOR INTEGRATED CIRCUIT (IC) PACKAGE

BACKGROUND

An integrated circuit (IC) may include one or more components of an electronic circuit. The one or more components may be included within a semiconductor chip (e.g., a silicon chip). In some aspects, the IC may be included within one or more electronic circuits for various applications. The one or more electronic circuits may be implemented, configured, and/or constructed using a printed circuit board (PCB).

SUMMARY

According to some implementations, a multi-branch terminal of an integrated circuit (IC), may include a first branch that may include an active bonding with a chip of the IC, wherein the active bonding may include a wire bonded to the chip of the IC; and a second branch that may include a passive bonding with the chip of the IC, wherein the passive bonding may include a capacitor bonded to the second branch and a first terminal of the IC.

According to some implementations, an integrated circuit (IC) package may include a chip; a first terminal bonded to the chip via a first wire; a second terminal bonded to the chip via a second wire; and a multi-branch terminal. The multi-branch terminal may include a first branch comprising an active bonding to the chip, and a second branch comprising a passive bonding with the second terminal.

According to some implementations, a circuit for an alternator may include an integrated circuit (IC) package. The IC package may include a chip; a first terminal bonded to the chip via a first wire; a second terminal bonded to the chip via a second wire; and a multi-branch terminal. The multi-branch terminal may include a first branch that includes an active bonding with the chip, wherein the active bonding includes a third wire bonded to the chip, and a second branch that includes a passive bonding with the second terminal, wherein the passive bonding includes an internal capacitor bonded to the second branch and the second terminal.

DETAILED DESCRIPTION

Figure 1:
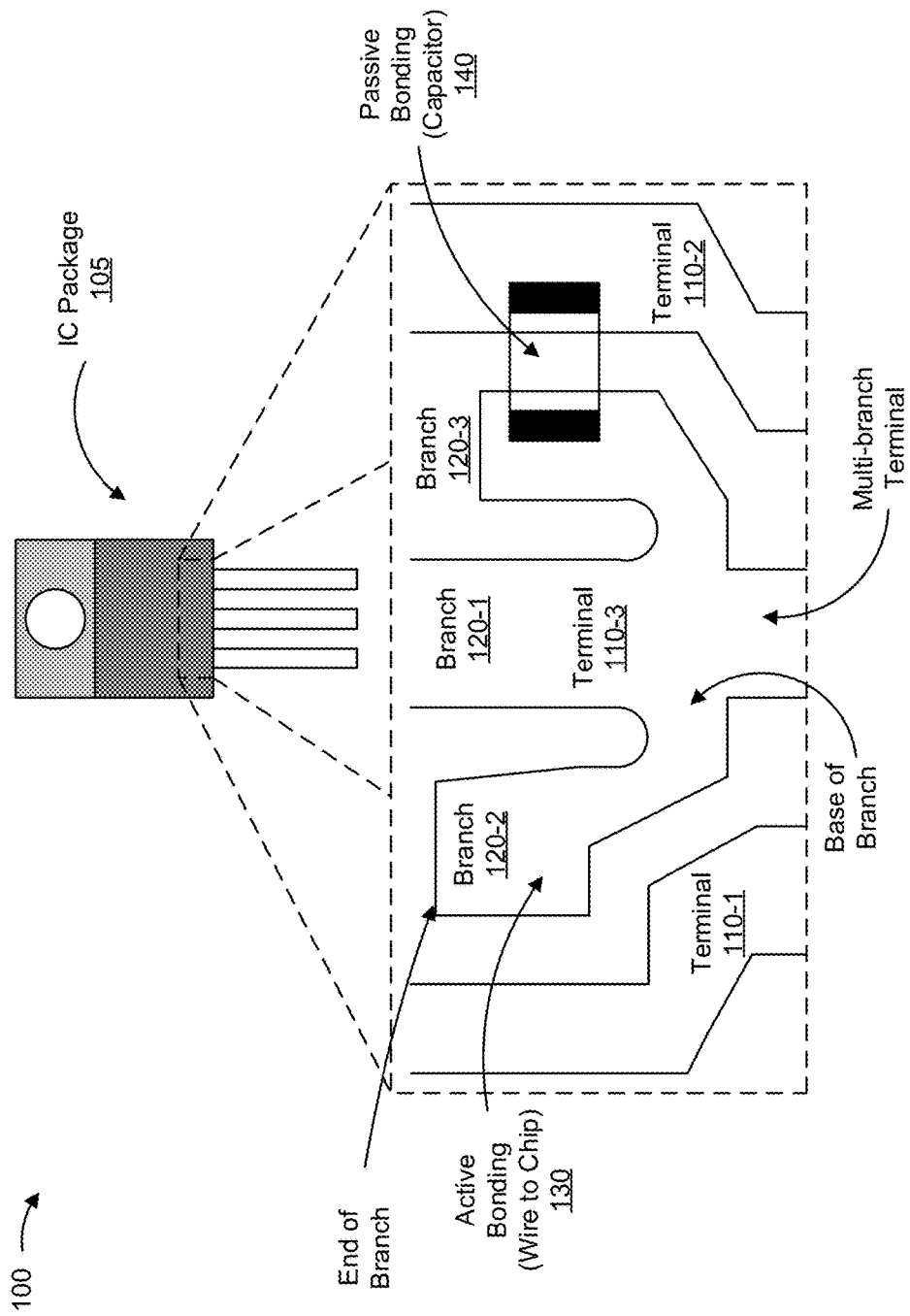
FIG. 1 is a diagram of an example implementation described herein.

The following detailed description of example implementations refers to the accompanying drawings. The same reference numbers in different drawings may identify the same or similar elements.

In some instances, an integrated circuit (IC) package is paired with one or more components within a circuit. For example, within an alternator (e.g., of a vehicle), a transistor outline (TO) package may be paired with a capacitor within a circuit associated with the alternator. In such cases, both the capacitor and the TO package may need to be installed within a housing of the alternator, which can require that the size of the housing of the alternator be large enough to include the capacitor and the TO package. Furthermore, in such cases, the capacitor may need to be a customized capacitor that is specifically designed to fit the housing and/or to be paired with the TO package, resulting in a need for non-standard capacitors and/or a more complex capacitor mounting process. Moreover, there can be a relatively long distance between the capacitor and the TO package when separately installed within the circuit. The greater the distance between the capacitor and the TO package within the circuit, the more the noise immunity of a signal output may be reduced from the TO package and/or the higher the emission of noise may be within the signal output.

Some implementations described herein provide a multi-branch terminal for an IC package to enable active bonding and passive bonding to a chip of the IC package. As described herein, to facilitate the passive bonding within the IC package, a component (e.g., a capacitor), that is not included on the chip of the IC package, can be included within a package housing of the IC package. As such, when installing the IC package within a circuit and/or within a housing (e.g., a housing of a device using the circuit), the mounting process of the IC package can be simplified as only a single component, rather than two separate components, are mounted.

Furthermore, some implementations, described herein, enable a housing of a device, that includes the IC package and/or the circuit of the IC package, to be formed to have less volume (or be smaller) than a housing of a device that does not include implementations described herein. For example, the housing would not need to have room for the IC package and a separate component because a multi-branch terminal of the IC package, as described herein, may enable a smaller, standard component to be installed within the IC package. Therefore, some implementations may conserve materials and/or manufacturing resources by enabling more housings to be manufactured from a same amount of material as previous techniques. According to some implementations, described herein, enabling a capacitor to be included within a package of the IC package provides improved noise immunity and lower noise emission within an output signal. As such, the quality of the signal can be improved, thus enabling conserved power resources and/or processing resources that may be associated with attempting to process output signals with relatively higher amounts of noise, as provided in previous techniques.

FIG. 1 is a diagram of an example implementation 100 described herein. Example implementation 100 of FIG. 1 includes an IC package 105 with three terminals 110-1 through 110-3 (hereinafter referred to collectively as terminals 110, and individually as terminal 110). In some implementations, IC package 105 may be configured to be included within a circuit (e.g., a circuit of an alternator) by inserting terminals 110 into a substrate (e.g., a printed circuit board (PCB) and/or the like) associated with the circuit. The terminals 110 may be soldered and/or electrically connected to vias of the substrate.

As shown in example implementation 100 of FIG. 1, terminal 110-3 is a multi-branch terminal. Accordingly, terminal 110-3 is referred to hereinafter as multi-branch terminal 110-3. Multi-branch terminal 110-3 includes three branches 120-1 through 120-3 ((hereinafter referred to collectively as branches 120, and individually as branch 120). Branches 120 may be formed from and/or attached to terminal 110-3 of IC package 105. In some implementations, multi-branch terminal 110-3 may be a ground terminal of IC package 105. A first branch 120-1 of multi-branch terminal 110-3 may connect to or be formed as part of a frame or support structure of IC package 105. In some implementations, the second branch 120-2 may be connected (e.g., via a wire) to a chip of IC package 105 via active bonding 130. Active bonding 130 may include a wire (or lead) from branch 120-2 to the chip of IC package 105.

As further shown in FIG. 1, a third branch 120-3 of multi-branch terminal 110-3 includes a passive bonding 140 with another terminal 110-2 of IC package 105. For example, the passive bonding 140 may include a component, such as a capacitor (e.g., a surface mount capacitor). According to some implementations, the component may be a standard component, having standard dimensions and/or standard characteristics. In some implementations, the component of passive bonding 140 can be installed during manufacturing of IC package 105. In some implementations, second terminal 110-2 may be connected (e.g., via a wire) to a chip of IC package 105.

In FIG. 1, each branch 120 of the multi-branch terminal 110-3 is included within IC package 105 (e.g., within a package housing of IC package 105). For example, each of the branches 120 from the base to the end of the branch, may be enclosed within IC package 105. Accordingly, as shown, IC package 105, when viewed externally, does not appear to include a multi-branch terminal. Furthermore, including branches 120 of the multi-branch terminal 110-3 enables a passive bonding from one or more of branches 120 to one or more terminals 110 of IC package 105. As such, any component used in the passive bonding can be embedded within IC package 105, thus enabling the component to be as close as possible to the chip of IC package 105 to improve noise immunity and lower noise emission within an output signal of IC package 105.

Accordingly, example implementation 100 provides an IC package 105 with a multi-branch terminal 110-3 to enable an active bonding 130 and passive bonding 140 between the multi-branch terminal 110-3 and a chip of the IC package. As such, the multi-branch terminal 110-3 provides additional surface area for active bonding 130 and passive bonding 140 to be included within IC package 105 (rather than externally). Accordingly, the multi-branch terminal 110-3 enables a component (e.g., a capacitor) of passive bonding 140 to be embedded within IC package 105. Therefore, the multi-branch terminal 110-3 and/or IC package 105 of example implementation 100 may allow for ease of use when installing and/or creating a circuit that is to include the IC package 105 and the component. For example, the multi-branch terminal 110-3 may ease design of the circuit within a PCB, installation of a component within a package housing of IC package 105, installation of a circuit within a device (e.g., an alternator) that is to include IC package 105, and/or the like. Furthermore, by providing the ability to include an internal component (e.g., an internal capacitor) within IC package 105, multi-branch terminal 110-3 and/or IC package 105 may conserve materials, costs, and/or the like by avoiding a need for additional space (or volume) within a package housing to hold an additional component (which may be a non-standard component) along with IC package 105. For example, the space of the housing may be a percentage less that corresponds to a size of an external component that is replaced by the internal component. Accordingly, the external component (e.g., an external, non-standard capacitor) may not be placed in connection with a previously used TO package, but the IC package 105, including the internal component, may have the same or equivalent functionality as if the external component were able to be included with a previously used TO package.

As indicated above, FIG. 1 is provided merely as an example. Other examples are possible and may differ from what was described with regard to FIG. 1.

Figure 2:
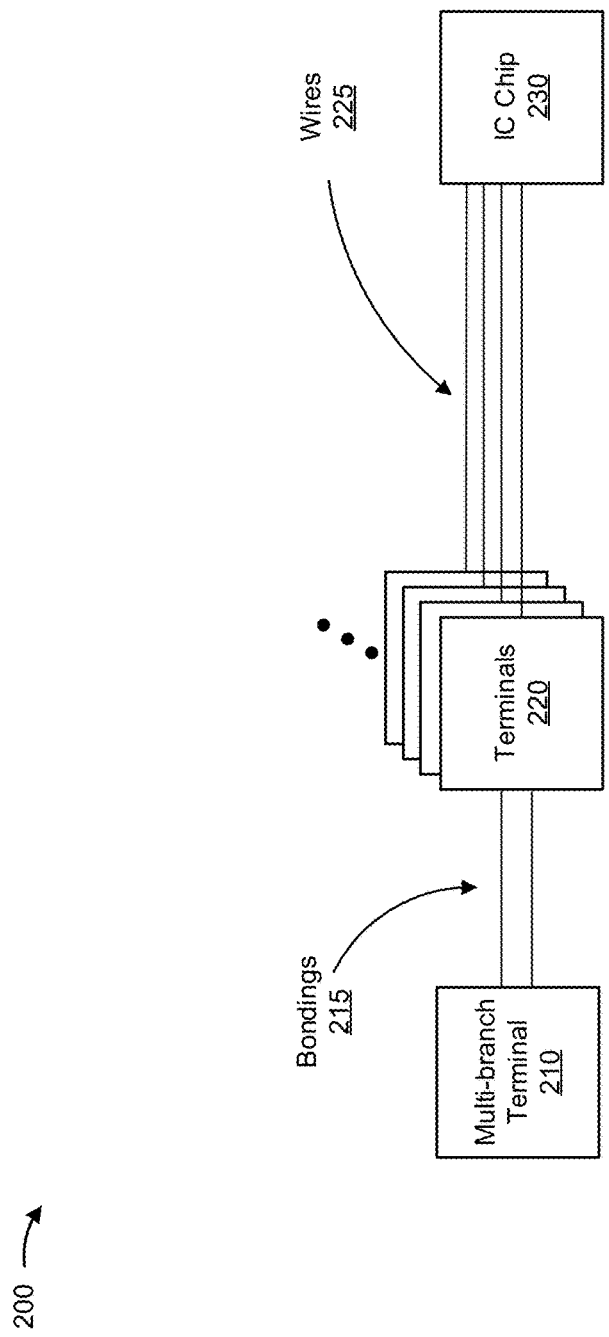
FIG. 2 is a diagram of an integrated circuit in which elements and/or circuits, described herein, may be implemented.

FIG. 2 is a diagram of an integrated circuit (IC) 200 in which elements (e.g., bondings, wires, leads, terminals, and/or the like) and/or components, described herein, may be implemented. As shown in FIG. 2, IC 200 may include a multi-branch terminal 210, bondings 215, terminals 220, wires 225, and an IC chip 230.

Multi-branch terminal 210 includes a terminal that has multiple branches (e.g., at least two branches). For example, multi-branch terminal 210 may include two or more branches, three or more branches, four or more branches, and/or the like. Multi-branch terminal 210 may be formed from and/or include any suitable conductive material, such as metal (e.g., aluminum, copper, and/or the like). Multi-branch terminal 210 may facilitate a connection between IC chip 230 and a circuit that includes IC 200. The multi-branch terminal 210 may include a plurality of branches that provide additional surface area to enable active bonding and/or passive bonding with terminals 220 within a package housing of IC 200. In some implementations, at least one of the branches of the multi-branch terminal 210 may connect to a frame of a package of IC 200. Additionally, or alternatively, at least one of the branches of the multi-branch terminal 210 may not connect to a frame of the package of IC 200.

As shown in FIG. 2, multi-branch terminal 210 is bonded to one or more of the terminals 220 via bondings 215. Bondings 215 may include one or more active bondings and/or one or more passive bondings. For example, a first branch of multi-branch terminal 210 may be bonded to a first terminal 220 via an active bonding (e.g., using an aluminum wire) and a second branch of multi-branch terminal 210 may be bonded to a second terminal 220, that is different from the first terminal, via a passive bonding (e.g., using a capacitor). In some implementations, multi-branch terminal 210 may be a ground terminal of IC 200. In some implementations, more than one multi-branch terminal 210 may be included in IC 200.

Terminals 220 may facilitate one or more connections between IC chip 230 and a circuit that includes IC 200. Terminals 220 may be formed from and/or include any suitable conductive material, such as metal (e.g., aluminum, copper, and/or the like). In some implementations, terminals 220 may be bonded to multi-branch terminal 210 via active bondings and/or passive bondings (e.g., depending on a design of a circuit of IC 200).

IC chip 230 may be any material that can be used to include a circuit. For example, IC chip 230 may be formed from a semi-conductor material (e.g., silicon) and include one or more components and/or one or more circuits. For example, IC chip 230 may be a TO package that includes one or more transistors and/or one or more circuits that include one or more transistors.

The number and arrangement of elements and/or components shown in FIG. 2 are provided as an example. In practice, there may be additional elements and/or components, fewer elements and/or components, different elements and/or components, or differently arranged elements and/or components than those shown in FIG. 2. Furthermore, two or more elements and/or components shown in FIG. 2 may be implemented within a circuit, or a single element or component shown in FIG. 2 may be implemented as multiple, distributed elements or components. Additionally, or alternatively, a set of circuits (e.g., one or more circuits) of IC 200 may perform one or more functions described as being performed by another set of circuits of IC 200.

Figure 3:
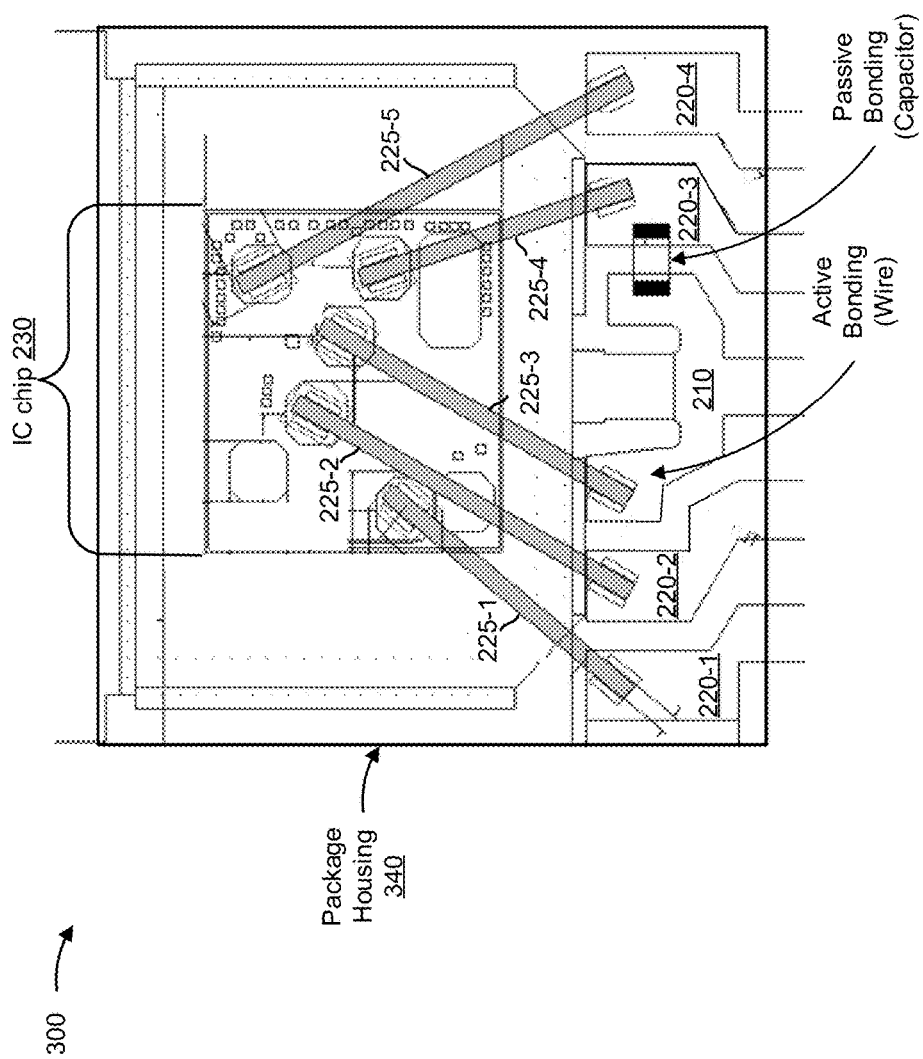
FIG. 3 is a diagram of an example implementation of the integrated circuit of FIG. 2.

FIG. 3 is a diagram of an example implementation 300 of IC 200 shown in FIG. 2. Example implementation 300 of FIG. 3 includes a multi-branch terminal 210, terminals 220-1 through 220-4 (referred to collectively as terminals 220), an IC chip 230, a package housing 340, and wires 225-1 through 225-5 (referred to collectively as wires 225). IC chip 230 may include various configured connections according to the circuit included on the IC chip 230. As such, the wires 225 may connect to IC chip 230 at different locations.

As shown in FIG. 3, multi-branch terminal 210 has three branches, similar to multi-branch terminal 110-3. A first branch of multi-branch terminal 210 is bonded, via an active bonding, to the chip and a second branch of multi-branch terminal 210 is bonded, via a passive bonding, to terminal 220-3.

As shown in FIG. 3, IC chip 230 is connected to multi-branch terminal 210 and terminals 220 via wires 225. Multi-branch terminal 210 is connected to IC chip 230 via wire 225-3. As shown, wire 225-3 is connected to a branch of multi-branch terminal 210 that includes an active bonding with terminal 220-2, according to a design of the circuit of the IC chip 230 and/or a design of a circuit that is to include the IC package of example implementation 300.

As further shown in FIG. 3, IC chip 230 and the branches of multi-branch terminal 210 are included within package housing 340. Furthermore, the passive bonding between a branch of multi-branch terminal 210 and terminal 210-3 includes a capacitor that is also within package housing 340 of example implementation 300. Accordingly, multi-terminal 210 enables both IC chip 230 and a component to be included within package housing 340.

As indicated above, FIG. 3 is provided merely as an example. Other examples are possible and may differ from what was described with regard to FIG. 3.

Figure 4:
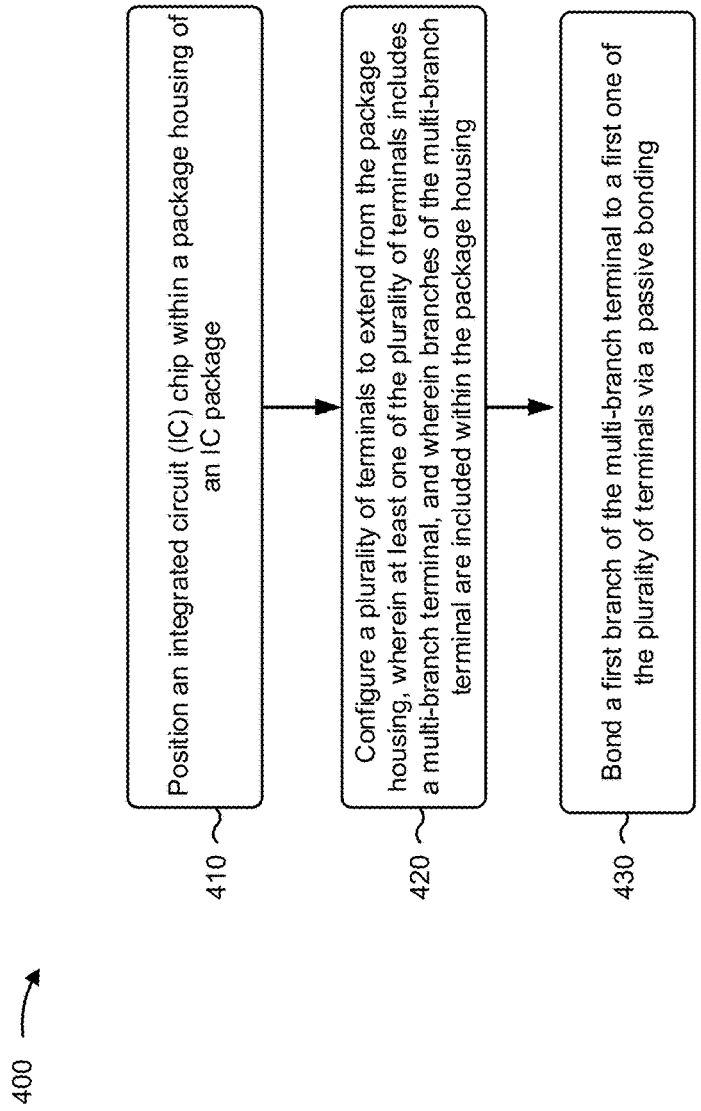
FIG. 4 is a flow chart of an example process associated with providing a multi-branch terminal for an integrated circuit package.

FIG. 4 is a flow chart of an example process 400 associated with including a multi-branch terminal within an integrated circuit package. In some implementations, one or more process blocks of FIG. 4 may be performed by a machine associated with manufacturing an integrated circuit package that includes a multi-branch terminal.

As shown in FIG. 4, process 400 may include positioning an integrated circuit (IC) chip within a package housing of an IC package (block 410). For example, IC chip 230 may be installed within package housing 340. IC chip 230 may be installed within package housing 340 during a manufacturing process. In some implementations, package housing 340 is configured to receive IC chip 230. In some implementations, the package housing is shaped and/or configured to be installed within a PCB and/or a housing of a particular device (e.g., an alternator).

As further shown in FIG. 4, process 400 may include configuring a plurality of terminals to extend from the package housing, wherein at least one of the plurality of terminals includes a multi-branch terminal, and wherein branches of the multi-branch terminal are included within the package housing (block 420). For example, multi-branch terminal 210 and terminals 220 may be configured to extend from package housing 340. As such, branches of multi-branch terminal (e.g., branches 120) may be configured to be entirely included or embedded within package housing 340. In some implementations, multi-branch terminal 210 may be formed and/or created prior to being positioned within package housing 340.

As further shown in FIG. 4, process 400 may include bonding a first branch of the multi-branch terminal to a first one of the plurality of terminals via a passive bonding (block 430). For example, one of the branches of multi-branch terminal 210 may be bonded to one of the terminals 220 using a component, such as a capacitor.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Accordingly, some implementations described herein provide a multi-branch terminal within an IC that enables active bonding and passive bonding with an IC chip from the multi-branch terminal. The multi-branch terminal may enable a component, such as a capacitor, to be included within a package housing of the IC. As such, because the component would not need to be included external to the IC, space for a circuit that includes such a component and the IC can be conserved. As such, materials associated with parts, housings, circuits, and/or the like can be conserved. Furthermore, moving the component closer to the IC (relative to the position of an external component) can improve noise immunity and decrease noise emission in a signal output from the IC.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A multi-branch terminal of an integrated circuit (IC), comprising:
   a first branch comprising an active bonding with a chip of the IC, wherein the active bonding comprises a wire bonded to the chip of the IC; and
a second branch comprising a passive bonding with the chip of the IC,
wherein the passive bonding comprises a capacitor bonded to the second branch and a first terminal of the IC.

2. The multi-branch terminal of claim 1, wherein the capacitor is included within a package of the IC.

3. The multi-branch terminal of claim 1, wherein the multi-branch terminal comprises at least three branches.

4. The multi-branch terminal of claim 1, wherein the multi-branch terminal comprises a ground terminal of the IC.

5. The multi-branch terminal of claim 1, wherein the first branch and the second branch are included within a package of the IC.

6. The multi-branch terminal of claim 1, wherein the first terminal is not a multibranch terminal.

7. The multi-branch terminal of claim 1, wherein at the first terminal includes multiple branches.

8. The multi-branch terminal of claim 1, further comprising:
a third branch that is connect to or formed as part of a frame of a package of the IC.

9. The multi-branch terminal of claim 8, wherein at least one of the first branch or the second branch is not connected to the frame of the package.

10. An integrated circuit (IC) package comprising:
a chip;
a first terminal bonded to the chip via a first wire;
a second terminal bonded to the chip via a second wire; and
a multi-branch terminal, comprising:
a first branch comprising an active bonding to the chip, and
a second branch comprising a passive bonding with the second terminal.

11. The IC of claim 10, wherein the passive bonding comprises a capacitor bonded to the second branch and the second terminal.

12. The IC of claim 11, wherein the capacitor and the chip are included within a same package housing the of the IC package.

13. The IC of claim 10, wherein the active bonding comprises a third wire bonded to the first branch and the chip.

14. The IC of claim 10, wherein the first branch and the second branch of the multi-branch terminal are embedded within a package housing of the IC package.

15. The IC of claim 10, wherein the multi-branch terminal comprises a ground terminal of the IC package.

16. A circuit for an alternator, comprising:
an integrated circuit (IC) package comprising:
a chip;
a first terminal bonded to the chip via a first wire;
a second terminal bonded to the chip via a second wire; and
a multi-branch terminal, comprising:
a first branch comprising an active bonding with the chip,
wherein the active bonding comprises a third wire bonded to the chip, and
a second branch comprising a passive bonding with the second terminal,
wherein the passive bonding comprises an internal capacitor bonded to the second branch and the second terminal.

17. The circuit of claim 16, wherein the circuit does not include an external capacitor that is external to the IC package and connected to the second branch and the second terminal.

18. The circuit of claim 16, wherein the internal capacitor is within a same package housing as the IC package.

19. The circuit of claim 16, wherein the multi-branch terminal comprises at least three branches.

20. The circuit of claim 16, wherein the IC package comprises a transistor outline (TO) package.

\* \* \* \* \*